US010292240B2

(12) United States Patent
Loster et al.

(10) Patent No.: US 10,292,240 B2
(45) Date of Patent: May 14, 2019

(54) SENSOR UNIT FOR LIGHT CONTROL

(71) Applicants: OSRAM GmbH, Munich (DE); Siteco Beleuchtungstechnik GmbH, Traunreut (DE)

(72) Inventors: Matthias Loster, Regensburg (DE); Gertrud Kraeuter, Regensburg (DE); Clemens Meyer, Traunstein (DE)

(73) Assignees: OSRAM GMBH, Munich (DE); SITECO BELEUCHTUNGSTECHNIK GMBH, Traunreut (DE)

( * ) Notice: Subject to any disclaimer, the term of this patent is extended or adjusted under 35 U.S.C. 154(b) by 58 days.

(21) Appl. No.: 15/022,570

(22) PCT Filed: Sep. 19, 2014

(86) PCT No.: PCT/EP2014/002647
§ 371 (c)(1),
(2) Date: Mar. 17, 2016

(87) PCT Pub. No.: WO2015/039764
PCT Pub. Date: Mar. 26, 2015

(65) Prior Publication Data
US 2016/0295664 A1  Oct. 6, 2016

(30) Foreign Application Priority Data

Sep. 20, 2013  (DE) .................. 10 2013 219 011

(51) Int. Cl.
*G01J 1/44* (2006.01)
*H05B 37/02* (2006.01)
(Continued)

(52) U.S. Cl.
CPC ....... *H05B 37/0227* (2013.01); *F21V 23/005* (2013.01); *F21V 23/0464* (2013.01);
(Continued)

(58) Field of Classification Search
CPC ............ H05B 37/0227; H05B 33/0806; H05B 33/0854; H05B 37/0218; F21V 23/0464;
(Continued)

(56) References Cited

U.S. PATENT DOCUMENTS 4,823,051 A * 4/1989 Young ................. F21V 23/0442
250/221
8,967,838 B1 * 3/2015 Miller ..................... F21K 9/233
362/239
(Continued)

FOREIGN PATENT DOCUMENTS

CN  1849707 A  10/2006
CN  102221412 A  10/2011
(Continued)

OTHER PUBLICATIONS

International Search Report based on Application No. PCT/EP2014/002647 (4 Pages) dated Jan. 19, 2015.
(Continued)

*Primary Examiner* — Christine S. Kim
(74) *Attorney, Agent, or Firm* — Viering Jentschura & Partner MBB

(57) ABSTRACT

Various embodiments may relate to a sensor unit having a plurality of sensor elements, the detection data of which are used for controlling an opto-electronic light source. According to various embodiments, the plurality of sensor elements are arranged on a substrate body, which is provided in the form of a molded circuit carrier made of a plastic material, and detect different regions and/or sizes.

20 Claims, 2 Drawing Sheets

(51) Int. Cl.
| | |
|---|---|
| *H03K 17/94* | (2006.01) |
| *F21V 23/00* | (2015.01) |
| *F21V 23/04* | (2006.01) |
| *H05B 33/08* | (2006.01) |
| *H05K 1/18* | (2006.01) |
| *F21Y 115/10* | (2016.01) |
| *F21Y 107/10* | (2016.01) |
| *F21Y 101/00* | (2016.01) |

(52) U.S. Cl.
CPC ............ *F21V 23/0471* (2013.01); *G01J 1/44* (2013.01); *H03K 17/94* (2013.01); *H05B 33/0806* (2013.01); *H05B 33/0854* (2013.01); *H05B 37/0218* (2013.01); *F21Y 2101/00* (2013.01); *F21Y 2107/10* (2016.08); *F21Y 2115/10* (2016.08); *H05K 1/181* (2013.01); *H05K 2201/09018* (2013.01); *H05K 2201/10106* (2013.01); *H05K 2201/10121* (2013.01); *H05K 2201/10151* (2013.01)

(58) Field of Classification Search
CPC ...... F21V 23/005; F21V 23/0471; G01J 1/44; H03K 17/94
See application file for complete search history.

(56) References Cited

U.S. PATENT DOCUMENTS

| | | | | |
|---|---|---|---|---|
| 2003/0117803 | A1* | 6/2003 | Chen | F21V 23/0471 362/276 |
| 2004/0105264 | A1* | 6/2004 | Spero | B60Q 1/04 362/276 |
| 2004/0232812 | A1 | 11/2004 | Beeson et al. | |
| 2005/0045802 | A1 | 3/2005 | Niemann et al. | |
| 2005/0061979 | A1* | 3/2005 | Narasako | G01S 17/023 250/338.3 |
| 2005/0207152 | A1* | 9/2005 | Maxik | F21K 9/90 362/231 |
| 2006/0261741 | A1* | 11/2006 | Hwang | F21V 23/04 315/56 |
| 2007/0007898 | A1 | 1/2007 | Bruning | |
| 2007/0195544 | A1* | 8/2007 | Graves, Jr. | F21V 23/0442 362/510 |
| 2010/0255742 | A1 | 10/2010 | Yun et al. | |
| 2011/0121971 | A1* | 5/2011 | Ross | A47G 33/02 340/541 |
| 2012/0056205 | A1 | 3/2012 | Allard et al. | |
| 2012/0068600 | A1* | 3/2012 | Hartmann | F21V 3/00 315/51 |
| 2014/0005895 | A1* | 1/2014 | Entenmann | G06F 3/017 701/49 |
| 2014/0085896 | A1* | 3/2014 | Li | F21V 17/007 362/249.04 |
| 2017/0135180 | A1* | 5/2017 | Broers | H05B 37/0227 |

FOREIGN PATENT DOCUMENTS

| | | |
|---|---|---|
| CN | 102388303 A | 3/2012 |
| CN | 102395829 A | 3/2012 |
| CN | 202852563 U | 4/2013 |
| DE | 10106183 A1 | 10/2002 |
| DE | 10340346 A1 | 4/2005 |
| DE | 102004053958 B3 | 9/2005 |
| DE | 102004017776 A1 | 11/2005 |
| DE | 102011014814 A1 | 9/2011 |
| TW | 515107 B | 12/2002 |
| WO | 2008119766 A1 | 10/2008 |
| WO | 2008135898 A1 | 11/2008 |
| WO | 2009059453 A1 | 5/2009 |
| WO | 2010115801 A1 | 10/2010 |

OTHER PUBLICATIONS

German Search Report based on Application No. 10 2013 219 011.5(5 Pages) dated Aug. 27, 2014.
Chinese Office Action based on application No. 201480051703.5 (6 pages and 10 pages of English translation) dated May 24, 2018.
European Communication based on application No. 14781441.2 (7 pages) dated Jul. 31, 2018.

* cited by examiner

SENSOR UNIT FOR LIGHT CONTROL

RELATED APPLICATIONS

The present application is a national stage entry according to 35 U.S.C. § 371 of PCT application No.: PCT/EP2014/002647 filed on Sep. 19, 2014, which claims priority from German application No.: 10 2013 219 011.5 filed on Sep. 20, 2013, and is incorporated herein by reference in its entirety.

TECHNICAL FIELD

Various embodiments may relate to a sensor unit for light control including a substrate body and a sensor element.

BACKGROUND

It is known from the related art, for the purpose of detecting data for driving a light source, to provide a motion detector that can detect the movement of an object in its detection region. In response to a corresponding detection, for example, the light source is then switched on by means of a control unit and switched off again for instance after a predefined time duration has elapsed.

The present disclosure addresses the technical problem of specifying a particularly advantageous sensor unit for light control.

SUMMARY

According to various embodiments, this problem is solved by a sensor unit for light control including a substrate body, on which a plurality of sensor elements are arranged, wherein the data detected by the plurality of sensor elements are provided for being fed to a control unit for controlling an optoelectronic light source, wherein a first sensor element of the plurality of sensor elements has a first detection region for detecting a first detection variable and a second sensor element of the plurality of sensor elements has a second detection region for detecting a second detection variable, and wherein the first sensor element and the second sensor element are arranged on the substrate body in such a way that the first detection region and the second detection region at least partly do not overlap (variant 1), and/or the first detection variable and the second detection variable are different with regard to their type (variant 2), wherein the substrate body is provided as a primary-formed circuit carrier composed of a plastics material.

According to various embodiments, therefore, at least two sensor elements are arranged on the substrate body and, in accordance with variant 1, are aligned in such a way that the respective detection regions at most partly overlap. In other words, a total detection region resulting as it were as a union of the individual detection regions is then intended to be larger than the individual detection regions. The unit according to various embodiments enables a spatially enlarged total detection regions which is adaptable depending on the field of application, and/or the detection of different variables (variant 2), for instance movement and brightness at the same time. In this case, adaptation at the sensor element level (of the sensor element type) is not necessary, which can help to reduce the logistical complexity in manufacturing, for example.

The "primary-formed" circuit carrier provided here as a substrate body is a solid body that was produced from a substance which previously had generally been shapeless at least temporarily, for example as an extruded part (extruded circuit carrier) or preferably as an injection-molded part (injection-molded circuit carrier). Correspondingly, the possibilities for the arrangement of the sensor elements can be extended and the detection regions can in particular also be arranged with respective main detection directions tilted with respect to one another.

For comparison, for example, on a planar FR4 printed circuit board, the sensor elements could be arranged in a manner merely offset laterally with respect to one another in the same plane, that is to say with parallel main detection directions, or angled holding devices would additionally have to be mounted for tilting, which means an extra outlay and also increases the probability of mounting faults.

By virtue of the fact that the substrate body is simultaneously a circuit carrier, the integration depth is furthermore increased even further because a conductor track function is also performed. The sensor elements can be electrically conductively connected for example via an integrated conductor track structure to one another and/or to a control unit, which, in a preferred configuration, is also arranged on the substrate body. The sensor elements or further components "arranged" on the substrate body are positionally fixed relative to the substrate body, specifically preferably by means of a planar connection, for instance by means of a joining connection; particularly preferably, they are adhesively bonded or soldered thereon.

A "detection region" can be for example the volume within which the respective sensor element detects with a probability of at least 70%, 80%, 90%, 95%, 97%, 98% or 99%, for instance in the case of a sensor element provided for detecting a movement. In the case of a sensor element provided for detecting a brightness/change in brightness, the "detection region" can be e.g. the solid-angle range from which light is incident on the active region (serving for detection) of the sensor element, wherein the detection region then extends to a distance of not more than 10 m, with increasing preference in this order not more than 8 m, 6 m, 5 m, 4 m, 3 m, 2 m, or 1 m, with respect to the sensor element (that is to say that a volume is again defined).

With regard to an extension of the total detection region, it may be preferred for not more than 50%, with increasing preference in this order not more than 40%, 30% or 20%, of the first detection region to overlap the second detection region. In this respect, the detection regions can be regarded as three-dimensional values whose intersection (that is to say whose "overlap") is considered and compared, with regard to its value, with that of the first detection region.

In various embodiments, at least one region of the surface of the substrate body is embodied as at least partly convex, and the first sensor element and/or the second sensor element are/is arranged in this surface region. In this case, "at least partly convex" means that, as viewed in a sectional plane that includes a normal to the surface, at least one fitted curve applied to the surface, for instance a second-degree polynomial, is convex. With regard to a direction of rotation around the corresponding normal, this preferably holds true for all sectional planes (which include the normal) in an angular range of at least 180°, 270° or 315°. In general, the "partly convex" configuration is therefore intended not to rule out a slight local depression, for example.

In various embodiments, however, the at least partly convex surface region is free of concave sections, that is to say that the surface in that region is convex or at most regionally planar. In general, as a result of the arrangement of a sensor element in a (partly) convex surface region, the risk of "shading" of the detection region by the substrate body can be reduced and the detection regions can additionally be provided in a manner angularly tilted with respect to one another.

In general, however, a partial shading of a detection region by the substrate body is not intended to be ruled out, of course. It may even be of interest, for example in order to exclude specific solid angles/volumes from the detection; in the case of a light source provided on the substrate body, the substrate body e.g. (also) shade the sensor element with respect to said light source.

In various embodiments, the first sensor element and/or the second sensor element are/is designed to detect a movement of an object moving in the respective detection region. The sensor element thus serves for motion detection and can detect such a movement for instance by means of electromagnetic waves (for example radar), by means of ultrasound and/or preferably by means of infrared radiation, that is to say for instance as a PIR sensor element (passive infrared). Besides an enlargement of the total detection region, however, in the case of a sensor unit according to various embodiments, the overlap may also be advantageous per se, since the resolution can thus be improved, for instance in the case of PIR sensor elements.

In a preferred configuration, the first sensor element and/or the second sensor element are/is provided for detecting a brightness and/or a change in brightness. Light incident on the corresponding sensor element can thus be detected for example by means of a changing resistance (photoresistor), a photodiode or a CCD sensor element (charge-coupled device).

The optoelectronic light source can then be driven for example in such a way that a changing ambient brightness is at least partly compensated for, that is to say that the light source is switched on or operated with increased power for example as daylight decreases. Insofar as—in a preferred configuration—the optoelectronic light source is also arranged on the substrate body, a sensor element provided for detecting the brightness can then be arranged for example in a surface region opposite to the light source. In this regard, for example, it is possible to reduce the risk that light originally emitted by the light source and reflected back will be incident on the sensor element and corrupt the detection.

In a preferred configuration, in addition to the sensor elements, the optoelectronic light source is also arranged on the substrate body; particularly preferably, a plurality of optoelectronic light sources are arranged thereon, which further increases the integration depth. This is because the same substrate body then serves for the spatial alignment of the detection regions and at the same time for the alignment of the beam(s) emitted by the optoelectronic light source.

The term "optoelectronic light source" (also just "light source" hereinafter) can mean an inherently packaged LED and in general also an inherently unpackaged LED chip; an LED chip can for instance also be placed as a flip-chip onto the substrate body. Preferably, however, an LED already inherently packaged beforehand is arranged on the substrate body, said LED thus having its own package (in this case, it is also possible for a plurality of LED chips to be provided in a package), and "light source" refers thereto; in this respect, "package" means a certain, not necessarily complete, encapsulation with a potting material, for example, usually together with a carrier element serving for electrical and/or thermal contacting.

In a further configuration, the light source is arranged on the surface of the substrate body in such a way that part of the light emitted by it is incident on the surface of the substrate body. As a result of this partial shading, the circuit carrier additionally performs a light-shaping function, that is to say concomitantly determines the spatial emission characteristic not just with regard to the alignment. In this case, the substrate body itself is preferably not transmissive; in particular, diffuse transmission is not effected, even though transmissive regions can, of course, be incorporated into the substrate body, for instance a hole can be provided therein. In any case the substrate body, as a result of the shading, "cuts" out certain angles from the beam emitted by the light source, wherein the shaded (cut-out) light can be absorbed and/or reflected by the substrate body.

In a preferred configuration, the light source and the substrate body are provided in such a way that, as viewed in a sectional plane that includes the centroid ray of the light source, at least the light propagating within a continuous first shading angle range of 20° is incident on the substrate body. In this case, the vertex of the shading angle lies at the point of intersection between centroid ray and emission surface.

The shading angle range may be, with increasing preference in this order, at least 30°, 40°, 50°, 60°, 70°, 80° or 85°. The "centroid ray" arises as the centroid ray of the rays—weighted according to power—of the beam emitted by the LED; in the case of a rectangular emission surface exhibiting Lambertian emission, for instance, it lies at the surface midpoint perpendicular to the emission surface.

In a preferred configuration, the shading angle range is maximally tilted relative to the centroid ray—the shading angle range is a range "filled" with light, that is to say that the beam emitted by the LED is intended to be shaded beginning from the edge (maximum tilting angles). In other words, shading is thus effected beginning with rays maximally tilted relative to the centroid ray. Depending on the extent of the shading angle range, the latter can then reach as far as the centroid ray or even beyond that.

All this preferably applies not only to a first light source, but also to a second light source, and particularly preferably further light sources, for instance at least 2, 5, 8 or 10 light sources. A corresponding plurality of light sources may generally be preferred. Independently thereof, a multiplicity of sensor elements arranged on the substrate body may also be preferred, that is to say for instance at least 3, 4, 5, 6, 7, 8, 9 or 10 sensor elements.

In one preferred embodiment, a second light source is arranged in that region of the surface on which part of the light emitted by the first light source is incident directly (without prior reflection). This particularly preferably applies in each case in pairs to at least 25%, 50%, 75% of the light sources or all of the light sources.

In one preferred embodiment, a region of the surface in which light sources are arranged has, as viewed in a sectional plane that includes the overall centroid ray of the sensor unit, a shape corresponding to a conic at least sectionally; the "overall centroid ray" is formed as the average value of the entire rays emitted by the sensor unit and weighted according to power and corresponds to the rotation axis for instance in the case of an emission characteristic having rotational symmetry.

The surface thus has (as viewed in said sectional plane) sectionally a "shape corresponding to a conic", that is to say can describe part of an ellipse or of a circle or else of a hyperbola or parabola; in this respect, as viewed from a focal point of the conic shape, "sectionally" can mean a shape extending over an angular range of at least 45°, 90° or 135°.

In one preferred embodiment (which, particularly preferably, can be combined with a conic shape), the surface, as viewed in a sectional plane that includes the overall centroid ray, is embodied in a pot-shaped fashion, for example in a U- or V-shaped fashion, and a preferably circumferential edge of this pot shape is set back inward relative to a region of the surface on which the light sources are arranged. In other words, a surface region of the substrate body delimits a cavity (the pot shape) and conceals the latter by a collar (the edge set back inward) partly.

The "surface region" can for example be defined by an envelope tangent to the outer light sources of the arrangement or for instance also extend as far as a region in which, for instance as viewed in a sectional plane that includes the overall centroid ray, the direction of curvature of the substrate body surface changes, that is to say that the latter becomes convex.

This embodiment with "collar" is of interest particularly in the case of light sources which emit light of different colors, since light mixing can be effected in the cavity and the edge region set back inward simultaneously conceals the direct view of at least some of the components. To a certain extent, the edge region set back constitutes an "undercut", which can be realized in a particularly advantageous manner with an injection-molded or extruded circuit carrier provided according to various embodiments.

In a preferred configuration, the substrate body is embodied in an integral fashion, that is to say as a monolithic component without a material boundary. This relates, of course, only to the substrate body itself; a conductor track structure provided at the surface thereof, for instance, is composed of a metallic material.

Besides the conductor track structure serving for the electrical contacting of the sensor elements and preferably light source(s), in general structured coatings for directional and/or diffuse reflection or absorption can also be applied in order to locally influence the optical properties of the substrate. Preferably, on the surface, however, solely the conductor track structure serving for electrical contacting is provided and optical and/or thermal properties are set by particles embedded into the substrate body.

The "integral" configuration therefore does not exclude particles embedded into the substrate body and randomly distributed therein. An additive embedded into the substrate body may even be preferred (also independently of the integrality), for instance in order to impart diffuse and/or directionally reflective or purposefully absorbent properties to this surface; particularly preferably, for this purpose a color pigment is embedded into the substrate body, for instance titanium dioxide particles.

Generally, the provision of a diffusely reflective surface (of at least one surface region) may be preferred, which can generally also mean a directional diffuse (specularly diffuse) reflection and particularly preferably concerns a uniformly diffuse reflection, for instance by means of a coating and/or roughening of the surface. In this respect, the reflectivity in the visible range of the spectrum can be, for example, with increasing preference in this order, at least 30%, 40%, 50%, 60%, 70%, 80% or 90%, particularly preferably relative to a uniformly diffuse reflection.

A directionally reflective surface region may also be preferred, wherein for example a reflectivity of at least 90%, 95% or 98% may be preferred.

Moreover, additionally or else independently thereof, an additive can also fulfill a different function, that is to say that an additive for increasing the thermal conductivity of the substrate body can for example (also) be provided, for instance particles composed of an electrically nonconductive ceramic. For example, particles comprising BN, AlN, $Al_2O_3$ and/or SiC or particles consisting solely thereof can be embedded into the substrate body. The thermal conductivity of the substrate body can be increased relative to that of the basic material and can be, for example, with increasing preference in this order, at least 2 W/(mK), 4 W/(mK), 6 W/(mK), 8 W/(mK) or 10 W/(mK). Advantageously, for example, a separate heat sink can then be dispensed with, which can simplify construction and production.

Furthermore, an additive for increasing the strength of the substrate body can also be provided (additionally for increasing the reflectivity and/or conductivity or else independently thereof), which can increase freedom in shaping, in particular concerning minimum thicknesses. Therefore, fibers, for example, can be embedded in the substrate body, for example glass fibers and/or a mineral filler.

Generally, a symmetrically constructed substrate body may be preferred, for instance a rotationally symmetrical substrate body. The substrate body may also be translationally symmetrical, that is to say arise as a result of displacement, preferably linear displacement, of a segment, particularly in the case of an extruded circuit carrier.

Preference is given to a sensor unit in which a conductor track structure for the wiring of the sensor elements and, if appropriate, of the light source(s) is provided exclusively on the surface. In this case, therefore, through contacts or the like passing through the substrate body are dispensed with, that is to say conductor track pieces passing through the substrate body from one surface to the opposite surface, which can in turn simplify production. Particularly preferably, the conductor track structure is exclusively provided on the "inner" surface region also carrying the components and the opposite, "outer" surface region of the substrate body is free of the conductor track structure.

An "inner" surface region carrying light sources is preferably rather planar and not strip-shaped, that is to say that the smallest and largest extents of this surface region have for example a ratio of at least 1/5, with further preference at least 1/4, 1/3, 1/2 or 3/4; particularly preferably, the surface region is approximately square. Reference is made to the above definition of "surface region".

In a preferred configuration an outer surface region opposite to an inner surface region carrying a light source, preferably a plurality of light sources, is provided as an exterior surface of a luminaire body. In that case, therefore, the sensor unit according to various embodiments in a luminaire need not be covered on the rear side with a housing element of the luminaire, but rather is exposed in this respect. In this connection and also generally, it may be preferred for the sensor elements to be arranged on the outer surface region, particularly preferably exclusively there.

In the case of the surface region provided as the exterior surface of a luminaire, not only the surface of the substrate body that shapes the light emitted by the light sources but also an opposite exterior surface contribute to the aesthetic impression given to an observer by the sensor unit/luminaire. Various embodiments explicitly also relate to such a luminaire and the corresponding use of a lighting unit.

Generally, also independently of the specific configuration just mentioned, various embodiments is also directed to a luminaire including a sensor unit described in the context of this disclosure. Generally, "luminaire" can mean for example the device which is connected to the electrical power supply system via a socket or a clamping/screwing/soldering contact, for instance, and in which one or a plurality of lighting unit(s) can then be seated, that is to say held.

Various embodiments also relate to a set of at least two sensor units, wherein in each case the first sensor element and the second sensor element are arranged on the substrate body in such a way that the first detection region and the second detection region at least partly do not overlap. In this case, the substrate bodies of the at least two sensor units of the set are structurally identical to one another, that is to say produced for instance by injection molding using the same mold or by extrusion using the same die, but they differ in the arrangement of the respective plurality of sensor elements and, consequently, they have a different respective total detection region. Thus, different sensor units can be realized with only one type of substrate body, which can help to increase the modularity and reduce production costs. The sensor units of the set can "differ" for instance insofar as, for example, in the case of substrate bodies assumed to be arranged congruently, not more than 90%, 80%, 70%, 60% or 50% of the total detection region of the first sensor unit is intended to overlap the total detection region of the second sensor unit.

Various embodiments also relate to a method for producing a sensor unit described in the context of this disclosure, wherein the substrate body is primary formed from a plastics material, for instance extruded or preferably injection molded.

In this case, the term "injection-molded circuit carrier" relates to a body released from a cavity to which material that is flowable at least within certain limits was fed beforehand, said material being at least partly hardened in the cavity. It is preferably fed at elevated pressure, for example at at least 100 bar, 500 bar or 1000 bar; possible upper limits may be, for instance, 3000 bar, 2500 bar or 2250 bar. The hardening can be carried out for example at a hardening temperature different than the feed temperature, for example at a lower temperature in the case of a thermoplastic material and for instance at a higher temperature in the case of a thermosetting plastic material.

Also independently of injection molding, for example polypropylene (PP, in particular radiation-cross linked), polyamide (for example PA6, PA66, PA10, PA11, PA12), in particular high-temperature-resistant polyamide such as PPA or PA46, polyester (for example PBT, PET, PBT/PET, PCT, ABS, ABS/PC), polyphenylene sulfide, LCP and/or PEEK can be provided as "plastics material".

The conductor track structure can be applied, in principle, in the context of a multi-component injection molding, for example, wherein as one component the substrate body is injection molded, and as another component a metalizable plastic, for instance, which is subsequently coated electronically and/or in an electroless manner in a bath. A carrier with the conductor track structure can also be inserted into an injection mold and be subjected to film insert molding. In the case of such an in-mold technique, the conductor track structure can for example also be introduced into the injection mold by stamping or spraying. Furthermore, the conductor track structure can for example also be embossed onto the previously injection-molded substrate body in a hot embossing method, for instance proceeding from a metal film stamped simultaneously in the embossing press.

It is also possible to apply the conductor track structure by laser direct structuring, wherein a laser beam "writes" the conductor track structure on the surface of the (e.g. injection-molded or extruded) substrate body and in the process exposes nuclei embedded into the substrate body for the subsequent metallization. On the other hand, the conductor track structure can also be applied by methods known from semiconductor fabrication, that is to say by means of corresponding masking, wherein in exposed regions of a (resist) mask applied over a large area, for example, the conductor track structure can grow or a previously deposited metal layer (below the (resist) mask) can be removed, for example by etching. A plasma deposition is likewise possible, once again in conjunction with a masking.

Various embodiments also relate to the use of a sensor unit for a luminaire, in particular a luminaire for general lighting, in particular for lighting with a stationary luminaire, preferably for the lighting of a building, for instance the immediate surroundings thereof or preferably the interior thereof, in particular for illuminating a work surface, for instance a desk.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
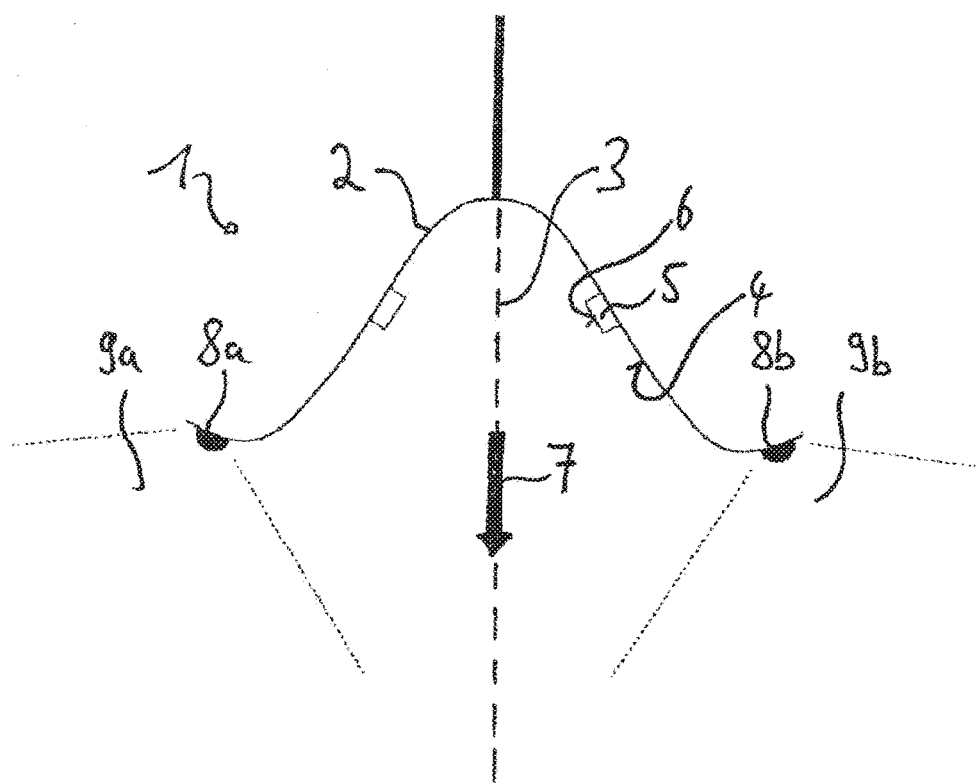
FIG. 1 shows a sensor unit according to various embodiments including sensor elements and LEDS.

FIG. 1 shows a sensor unit 1 according to various embodiments including an injection-molded substrate body 2 in a sectional illustration; the substrate body 2 is constructed rotationally symmetrically with respect to an axis 3 lying in the plane of the drawing.

On an inner surface 4 of the substrate body 2, a plurality of LEDs 5, to be precise in the present case a total of ten LEDs 5, are provided in a manner distributed over the circumference around the rotation axis 3. The LEDs 5 are each inherently packaged, that is to say are placed onto the inner surface 4 as already packed components during the production of the sensor unit 2. The light emitted by the LEDs 5 in each case in a Lambertian fashion at a respective emission surface 6 is partly incident on the inner surface 4, which is diffusively reflective on account of titanium dioxide particles embedded into the substrate body 2; the substrate body 2, that is to say the course of its inner surface 4, concomitantly determines the emission characteristic.

On account of the rotationally symmetrical substrate body 2 and the equidistant arrangement of the LEDs 5 with respect to the direction of rotation, the overall centroid ray 7 is oriented along the rotation axis 3.

According to various embodiments, a plurality of sensor elements 8 having a respective detection region 9 are provided on the substrate body 2. In the present case, four sensor elements 8 are arranged on the substrate body 2, to be precise with respect to the direction of rotation with a distance of 90° between respectively closest adjacent sensor elements 8.

The first detection region 9a of the first sensor element 8a only partly overlaps the second detection region 9b of the second sensor element 8b, that is to say that the sensor elements 8a, b complement one another on account of their spatial arrangement. The total detection region that results overall is larger than each of the individual detection regions 9a, b. This is advantageous insofar as the passive infrared sensor elements 8a, b used for motion detection in the present case, each taken by themselves, cannot cover angular ranges of arbitrary magnitude.

Figure 2:
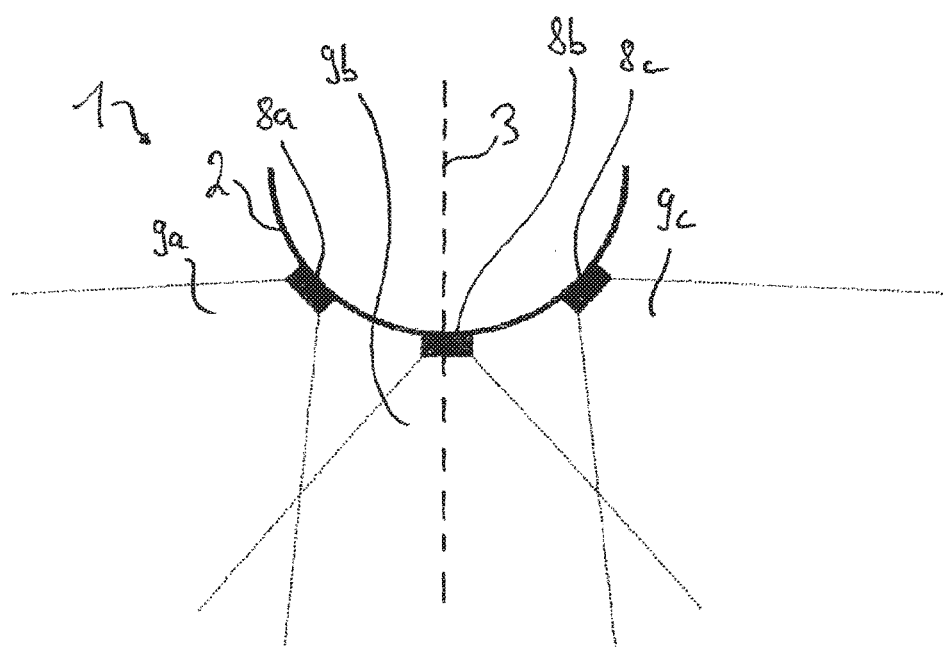
FIG. 2 shows a further sensor unit according to various embodiments.

FIG. 2 shows a further sensor unit 1, the injection-molded substrate body 2 of which is likewise constructed rotationally symmetrically with respect to an axis 3. The substrate body 2 has the shape of a hemisphere and in FIG. 2 is illustrated in a sectional plane that includes the axis 3.

This sectional illustration reveals a first sensor element 8a, a second sensor element 8b and a third sensor element 8c, these being pyrosensors which are provided for motion detection and make it possible to detect a movement on account of a respective faceting (not illustrated). By virtue of the arrangement of the sensor elements 8a, b, c, firstly, the total detection region is enlarged; secondly, on account of the overlap, the resolution can also be increased, particularly at relatively large distances.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A sensor unit for light control comprising:
a substrate body on which a plurality of sensor elements are arranged,
wherein the data detected by the plurality of sensor elements are provided for being fed to a control unit for controlling at least one optoelectronic light source,
wherein a first sensor element of the plurality of sensor elements has a first detection region for detecting a first detection variable and a second sensor element of the plurality of sensor elements has a second detection region for detecting a second detection variable,
wherein the substrate body has a surface region with at least one at least partially convex portion and at least one adjacent at least partially concave portion,
wherein the substrate body is provided as a primary-formed circuit carrier composed of a plastics material;
and wherein the first sensor element and the second sensor element are arranged on the substrate body in such a way that the first detection region and the second detection region at least partly do not overlap, and/or the first detection variable and the second detection variable are different with regard to their type.

2. The sensor unit as claimed in claim 1, wherein the first sensor element and the second sensor element are arranged on the substrate body in such a way that not more than 50% of the first detection region overlaps the second detection region.

3. The sensor unit as claimed in claim 1, wherein at least one of the first sensor element and the second sensor element is arranged in the at least partly convex surface region.

4. The sensor unit as claimed in claim 1, wherein the at least one optoelectronic light source is arranged on the substrate body and designed to emit light depending on a value detected by the sensor elements.

5. The sensor unit as claimed in claim 4, wherein the at least one optoelectronic light source is arranged on the surface of the substrate body in such a way that part of the light emitted by the at least one optoelectronic light source is incident on the surface of the substrate body.

6. The sensor unit as claimed in claim 5, wherein a second optoelectronic light source is arranged on the substrate body, specifically in that region of the surface on which part of the light emitted by the first light source is incident directly.

7. The sensor unit as claimed in claim 4, wherein at least one surface region of the substrate body that is arranged oppositely to a surface region carrying the at least one optoelectronic light source is provided as an exterior surface of a luminaire.

8. The sensor unit as claimed in claim 1, wherein the substrate body is embodied in an integral fashion.

9. The sensor unit as claimed in claim 1, wherein the substrate body is an injection-molded circuit carrier.

10. The sensor unit as claim in claim 1, wherein the plurality of sensor elements are configured to detect the movement through electromagnetic waves, ultrasound and/or infrared radiation.

11. The sensor unit as claimed in claim 10, wherein the movement detected through infrared radiation is configured to be detected with a PIR sensor element.

12. The sensor unit as claimed in claim 1, wherein the plurality of sensor elements are configured to detect the movement at a non-zero distance from the plurality of sensors.

13. The sensor unit as claimed in claim 1, wherein the plurality of sensor elements are non-capacitive sensors.

14. The sensor unit as claimed in claim 1, wherein the plurality of sensor elements are presence sensors.

15. The sensor unit as claimed in claim 1, wherein at least one of the first sensor element and the second sensor element is configured to detect a movement of an object moving relative to the respective sensor element.

16. The sensor unit as claimed in claim 1, wherein the first sensor element is configured to measure at least one of an absolute brightness and a change in brightness.

17. The sensor unit as claimed in claim 1, wherein at least one of the at least one optoelectronic light sources is disposed in the at least partially concave portion.

18. The sensor unit as claimed in claim 1, wherein at least one of the first sensor element and the second sensor element is disposed outside the at least partially concave portion.

19. A set of at least two sensor units for light control, each sensor unit comprising:
a substrate body, on which a plurality of sensor elements are arranged, wherein the data detected by the plurality of sensor elements are provided for being fed to a control unit for controlling at least one optoelectronic light source,
wherein a first sensor element of the plurality of sensor elements has a first detection region for detecting a first detection variable and a second sensor element of the plurality of sensor elements has a second detection region for detecting a second detection variable,
wherein the substrate body has a surface area with at least one at least partially convex portion and at least one adjacent at least partially concave portion;
wherein the substrate body is provided as a primary-formed circuit carrier composed of a plastics material;
and wherein the first sensor element and the second sensor element are arranged on the substrate body in such a way that the first detection region and the second detection region at least partly do not overlap, and/or the first detection variable and the second detection variable are different with regard to their type;
wherein each sensor unit has a corresponding total detection region resulting from the totality of the respective detection regions, wherein the substrate bodies of the at least two sensor units of the set are structurally identical to one another, but the at least two sensor units differ in the arrangement of the respective plurality of sensor elements in such a way that the at least two sensor units differ with regard to their respective total detection region.

20. A method for producing a sensor unit, the method comprising,
  providing a substrate body, on which a plurality of sensor elements are arranged,
  wherein the data detected by the plurality of sensor elements are provided for being fed to a control unit for controlling at least one optoelectronic light source,
  wherein a first sensor element of the plurality of sensor elements has a first detection region for detecting a first detection variable and a second sensor element of the plurality of sensor elements has a second detection region for detecting a second detection variable,
  wherein the substrate body has a surface area with at least one at least partially convex portion and at least one adjacent at least partially concave portion;
  wherein the substrate body is provided as a primary-formed circuit carrier composed of a plastics material;
  and wherein at least one of the first sensor element and the second sensor element are arranged on the substrate body in such a way that the first detection region and the second detection region at least partly do not overlap, and/or
  the first detection variable and the second detection variable are different with regard to their type.

* * * * *